United States Patent
Kunishima

(10) Patent No.: US 7,981,574 B2
(45) Date of Patent: Jul. 19, 2011

(54) RETICLE, AND METHOD OF LAYING OUT WIRINGS AND VIAS

(75) Inventor: Hiroyuki Kunishima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 141 days.

(21) Appl. No.: 12/318,951

(22) Filed: Jan. 13, 2009

(65) Prior Publication Data

US 2009/0186284 A1 Jul. 23, 2009

(30) Foreign Application Priority Data

Jan. 21, 2008 (JP) ................................ 2008/010509

(51) Int. Cl.
*G03F 1/00* (2006.01)
(52) U.S. Cl. .............................. 430/5; 430/311; 430/394
(58) Field of Classification Search .................... 716/19, 716/21, 10, 5; 430/5, 311, 394
See application file for complete search history.

(56) References Cited

U.S. PATENT DOCUMENTS

| 7,023,094 | B2 | 4/2006 | Suga |
| 7,365,431 | B2 | 4/2008 | Matsubara |
| 2002/0162079 | A1* | 10/2002 | Igarashi et al. .................... 716/2 |
| 2004/0262640 | A1 | 12/2004 | Suga |
| 2005/0179134 | A1 | 8/2005 | Matsubara |
| 2006/0118966 | A1 | 6/2006 | Suga |
| 2007/0011638 | A1* | 1/2007 | Watanabe et al. ............... 716/10 |

FOREIGN PATENT DOCUMENTS

| JP | 2005-19604 | 1/2005 |
| JP | 2005-268748 | 9/2005 |

* cited by examiner

*Primary Examiner* — Mark F Huff
*Assistant Examiner* — Rashid Alam
(74) *Attorney, Agent, or Firm* — McGinn IP Law Group, PLLC

(57) ABSTRACT

Provided is a reticle used for forming a plurality of vias for connecting first wirings provided in a first wiring layer and second wirings provided in a second wiring layer formed above the first wiring layer. The first wirings and the second wirings are provided along one of a first direction and a second direction, and the first direction and the second direction perpendicularly cross each other. The reticle includes a plurality of via opening patterns for forming the plurality of vias. Each of the plurality of via opening patterns has a rectangular shape, and is arranged to cause each side of each of the via opening patterns to be diagonal with respect to the first direction and the second direction.

20 Claims, 8 Drawing Sheets

RETICLE, AND METHOD OF LAYING OUT WIRINGS AND VIAS

BACKGROUND OF THE INVENTION

1. Field of the Invention

The present invention relates to a reticle, and a method of laying out wirings and vias.

2. Description of the Related Art

Recently, with the miniaturization of semiconductor devices, there is a demand for reduction in a distance between wirings to increase a wiring density (see Japanese Patent Application Laid-open No. 2005-19604; hereinafter, referred to as Patent Document 1). In response to such a demand, it is necessary to increase a degree of integration even for vias which are formed for the connection between the wirings in upper and lower wiring layers. On the other hand, if the degree of integration is increased by the miniaturization of an element, it becomes difficult to form the vias as designed in some cases.

FIG. 4 illustrates an example of a conventional method of laying out the wirings and the vias. In FIG. 4, a first wiring layer including first wirings 103 and a second wiring layer including second wirings 105 are illustrated. Each of the first wirings 103 and the second wirings 105 is provided along at least one of a first direction and a second direction which perpendicularly cross each other. In such a wiring structure, the vias are arranged to allow a wiring pitch and a via pitch to have the same minimum size. Each side of the rectangular via is arranged to be parallel to or perpendicular to the first and second wirings. If a large number of vias are provided to be close to each other in such a via arrangement, it becomes difficult to resolve a via opening pattern due to the increased degree of integration for the formation of the via opening pattern by light exposure using photolithography. Moreover, even if the via opening pattern is resolved, a resist between the vias loses its shape to increase a frequency of occurrence of a short between the vias during an operation of the semiconductor device. For example, as illustrated in FIG. 6, when the distance between the vias is small, via holes 107 link together after development in some cases. As a result, the short between the vias disadvantageously occurs in an area where the vias are formed at a high density, during the operation of the semiconductor device. Further, the deformation of the via occurs to obstacle the burial of a wiring material.

As one of the reasons for the occurrence of the problem as described above, the following fact is given. In a via hole formation step by the photolithography, a distance between the via opening patterns on a reticle becomes smaller as compared with a light wavelength used for the light exposure. When the patterns of vias or wirings at a high density are to be formed by the photolithography, an optical interference phenomenon is used. By using an optical interference effect between the via patterns or the wiring patterns, an effective contrast ratio can be increased as illustrated in FIG. 7. Therefore, a resolving power can be increased. If the distance between the via opening patterns is smaller than the light wavelength used for the light exposure, it becomes difficult to resolve the neighboring via opening patterns. As the via opening patterns becomes closer to each other, this tendency becomes more remarkable. The reason for this is as follows. When the distance between the neighboring via opening patterns is smaller than the light wavelength used for the light exposure, diffracted waves come closer to each other as illustrated in FIG. 8, resulting in a smaller amplitude of a composite wave. As the via opening patterns become closer to each other, the amplitude of the composite wave becomes smaller. As a result, the effective contrast ratio is lowered. Therefore, as the via opening patterns become closer to each other, there is a point at which each of the via opening patterns is no longer satisfactorily resolved. If the resolution is insufficient, there is a fear that even a part which is not desired to be dissolved is disadvantageously dissolved at the time of development of the via opening patterns on the resist after the light exposure. As a result, the via shape is sometimes deformed to result in the occurrence of the short between the vias in the worst case. Furthermore, when the via shape is deformed even if the via is successfully resolved, there is a fear that an initial breakdown voltage during the operation of the semiconductor device may be lowered. As a result, a yield and a reliability of the semiconductor device are lowered in some cases. For the reason as described above, there is a demand in terms of a process that the distance between the vias is increased as much as possible when the distance between the via opening patterns is smaller than the light wavelength used for the light exposure.

As the arrangement for allowing the distance between the vias to be increased as much as possible, there is an arrangement as described in Japanese Patent Application Laid-open No. 2005-268748 (hereinafter, referred to as Patent Document 2), for example. Patent Document 2 describes a construction in which the zigzag arrangement of the vias allows the minimum pitch size for contacts to be larger than the minimum wiring size in a multi-layered wiring structure including lower wirings and upper wirings deposited thereon and via contacts for connecting the lower and upper wirings, as shown in FIG. 5. In Patent Document 2, the structure described above can ensure a certain process margin in the contact formation.

With the further miniaturization in recent years, however, the minimum distance between the vias is further reduced. Therefore, even when the vias are arranged as illustrated in FIG. 5, there still exist the problems such as the via deformation and the occurrence of the short between the vias which constitutes one of the reasons for failure occurring during the operation of the semiconductor device. Therefore, there is a fear that incomplete burial of the via or a reduction in yield of products may be brought about. In order to remedy the problems as described above, the arrangement with a further larger distance between the vias advantageously acts on the resolution, the short between the vias, the via deformation, and the like. On the other hand, when the distance between the vias is increased, there arises another problem of a lowered degree of integration of the vias.

SUMMARY OF THE INVENTION

The present invention provides a reticle used for forming a plurality of vias for connecting a plurality of first wirings provided in a first wiring layer and a plurality of second wirings provided in a second wiring layer formed above the first wiring layer to each other, the plurality of first wirings and the plurality of second wirings being provided along one of a first direction and a second direction, the first direction and the second direction perpendicularly crossing each other, the reticle including a plurality of via opening patterns for forming the plurality of vias, in which: each of the plurality of via opening patterns has a rectangular shape; the plurality of via opening patterns are arranged to cause each side of each of the plurality of via opening patterns to be diagonal with respect to the first direction and the second direction; and a minimum distance between neighboring two of the plurality of via opening patterns, which are arranged diagonally with respect to the first direction and the second direction, is made to be larger, by rotating the plurality of via opening patterns with a center point of each of the plurality of via opening patterns being fixed, than a minimum distance between the plurality of via opening patterns when the plurality of via opening patterns are arranged to cause each side of each of the plurality of via opening patterns to be one of parallel to and perpendicular to the first direction and the second direction.

In the present invention, the wirings and the vias are arranged in a predetermined layout to obtain desired wiring density and degree of integration of vias. Further, the reticle according to the present invention has the via opening pattern in a predetermined shape. In this manner, the reticle can increase the minimum distance between the neighboring via opening patterns without lowering the degree of integration of the vias for connecting the wirings to each other. As a result, the reticle, which is capable of restraining the via shape from being deformed or the like and also restraining the occurrence of a short between the vias, is provided.

The present invention also provides a method of laying out wirings and vias, including: providing a plurality of first wirings in a first wiring layer; forming a plurality of the vias connected to the plurality of first wirings by light exposure using a reticle; and providing a plurality of second wirings to be connected to the plurality of vias in a second wiring layer different from the first wiring layer, in which: the plurality of first wirings and the plurality of second wirings are provided along one of a first direction and a second direction, the first direction and the second direction perpendicularly crossing each other; the reticle includes a plurality of via opening patterns for forming the plurality of vias; each of the plurality of via opening patterns has a rectangular shape; the plurality of via opening patterns are arranged to cause each side of each of the plurality of via opening patterns to be diagonal in plan view with respect to the first direction and the second direction; and a minimum distance between neighboring two of the plurality of via opening patterns, which are arranged diagonally with respect to the first direction and the second direction, is made to be larger, by rotating the plurality of via opening patterns with a center point of each of the plurality of via opening patterns being fixed, than a minimum distance between the plurality of via opening patterns when the plurality of via opening patterns are arranged to cause each side of each of the plurality of via opening patterns to be one of parallel to and perpendicular to the first direction and the second direction.

Further, the present invention provides a method of fabricating a semiconductor device using the reticle according to the present invention. The semiconductor device fabricated according to the present invention has improved product yield, reliability, and lifetime because the short between the vias is restrained and burying performance for the vias is improved.

By using the reticle and the method of laying out the wirings and the vias according to the present invention, a resolution of the via between the neighboring via opening patterns is improved even when the distance between the via opening patterns is smaller than a light wavelength used for light exposure at the time of light exposure. As a result, the deformation of the via shape can be restrained without lowering the degree of integration of the vias for connecting the wirings to each other. As a result, the short between the vias, which constitutes one of the reasons for failure during the operation of the semiconductor device, can be restrained. Moreover, the burying performance for the via is improved to improve the yield of products. Therefore, according to the present invention, the method of fabricating the semiconductor device with the improved yield, reliability, and lifetime is provided.

DETAILED DESCRIPTION OF THE PREFERRED EMBODIMENT

Figure 1:
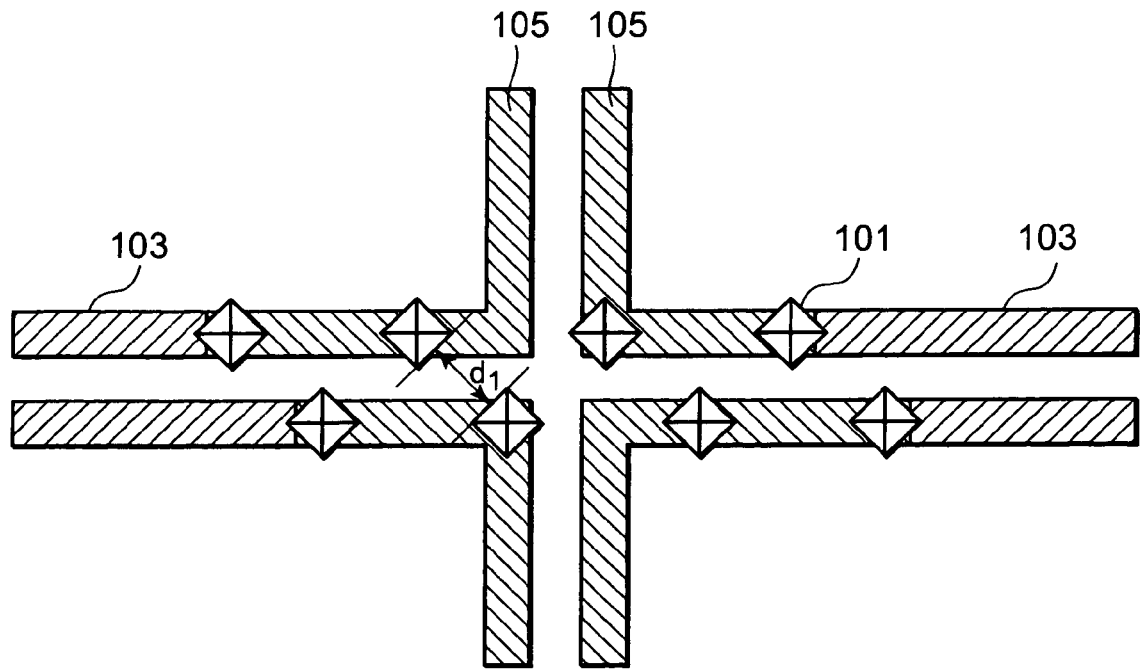
FIG. 1 is a schematic plan view illustrating a layout of wirings and vias according to an embodiment of the present invention.

Hereinafter, an embodiment of the present invention is described referring to the accompanying drawings. Throughout the drawings, the same component is denoted by the same reference numeral, and the description thereof is omitted when appropriate.

FIG. 1 is a plan view illustrating an example of a method of laying out wirings and vias according to this embodiment. In FIG. 1, a wiring structure is illustrated. The wiring structure includes a plurality of first wirings 103 provided in a first wiring layer and a plurality of second wirings 105 provided in a second wiring layer formed above the first wiring layer. In FIG. 1, a shaded area with falling diagonal lines from top right to bottom left represents the first wiring 103, whereas a shaded area with falling diagonal lines from top left to bottom right represents the second wiring 105. Further, via opening patterns 101 formed on a reticle used in this embodiment is illustrated on the wiring structure described above in an overlapping manner. Hereinafter, the reticle for forming a plurality of via contacts (hereinafter, referred to simply as "vias") for connecting the first wirings 103 and the second wirings 105 to each other is described. A method of laying out the wirings and the vias using such a reticle is also described.

As illustrated in FIG. 1, the plurality of first wirings 103 and the plurality of second wirings 105 are provided along a first direction or a second direction. The first direction and the second direction perpendicularly cross each other. For example, in FIG. 1, the first direction is a laterally extending direction, whereas the second direction is a longitudinally extending direction which perpendicularly crosses the first direction. The first wirings 103 and the second wirings 105 may be provided in various arrangements. The first wirings 103 and the second wirings 105 may be formed along only any one of the first direction and the second direction, and may also be formed along both the first direction and the second direction. Further, each of the first wirings 103 and each of the second wirings 105 may be formed to perpendicularly cross each other. However, each of the first wirings 103 and each of the second wirings 105 are not necessarily required to perpendicularly cross each other.

The first wirings 103 and the second wirings 105 are provided in the different wiring layers. For example, the first wirings 103 are provided in the first wiring layer, whereas the second wirings 105 are provided in the second wiring layer. For example, the first wiring layer is a lower wiring layer, whereas the second wiring layer is an upper wiring layer.

Further, the reticle of this embodiment is described. The reticle used in this embodiment has a plurality of via opening patterns 101 for forming a plurality of vias for connecting the first wirings 103 and the second wirings 105 to each other. A shape of the via opening pattern 101 is rectangular, preferably, square. Although the shape of the via opening pattern 101 is illustrated as rectangular, a sectional shape of the via which is actually formed by using photolithography is generally circular.

Figure 5:
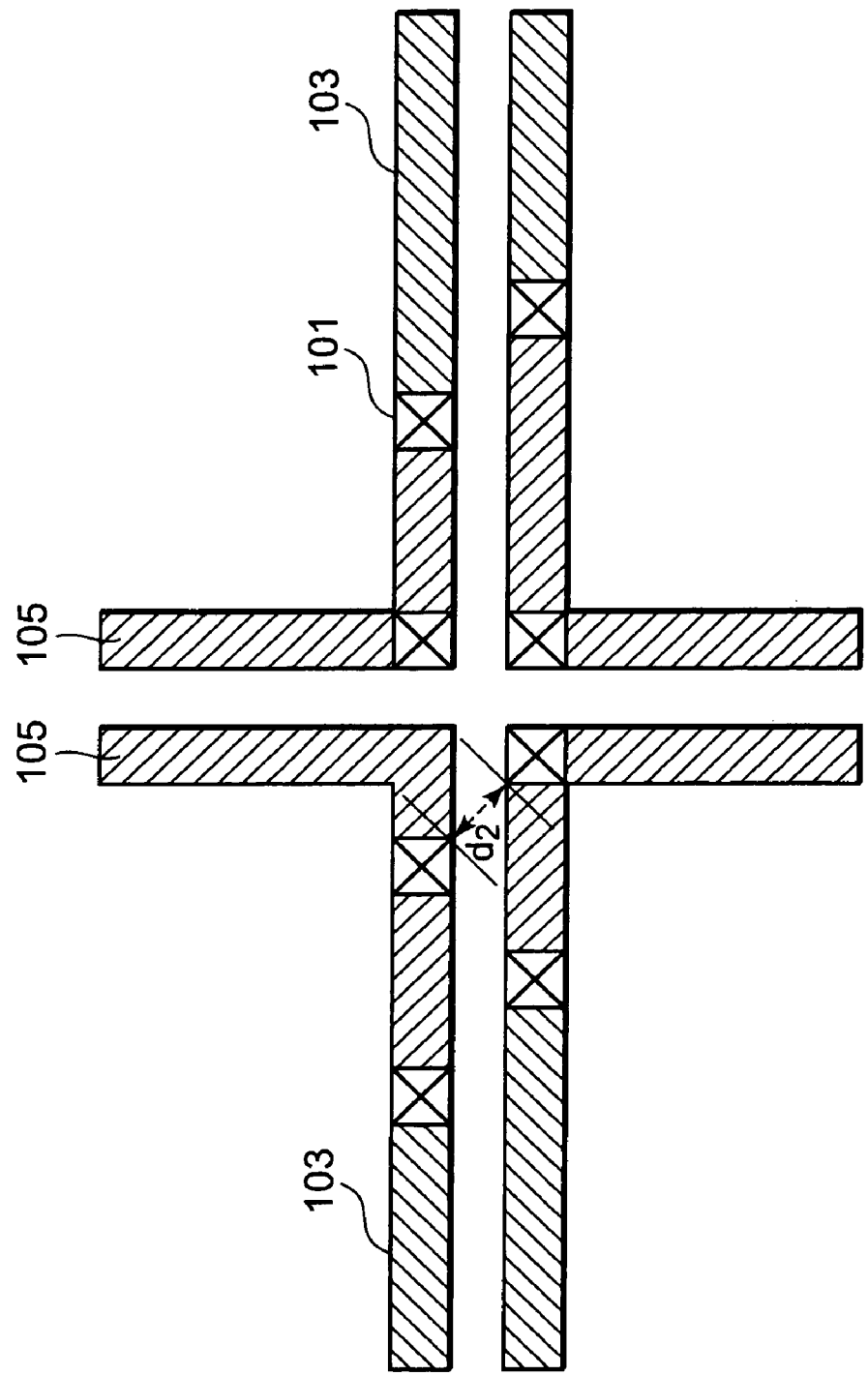
FIG. 5 is a schematic plan view illustrating another conventional layout of the wirings and the vias.
Figure 6:
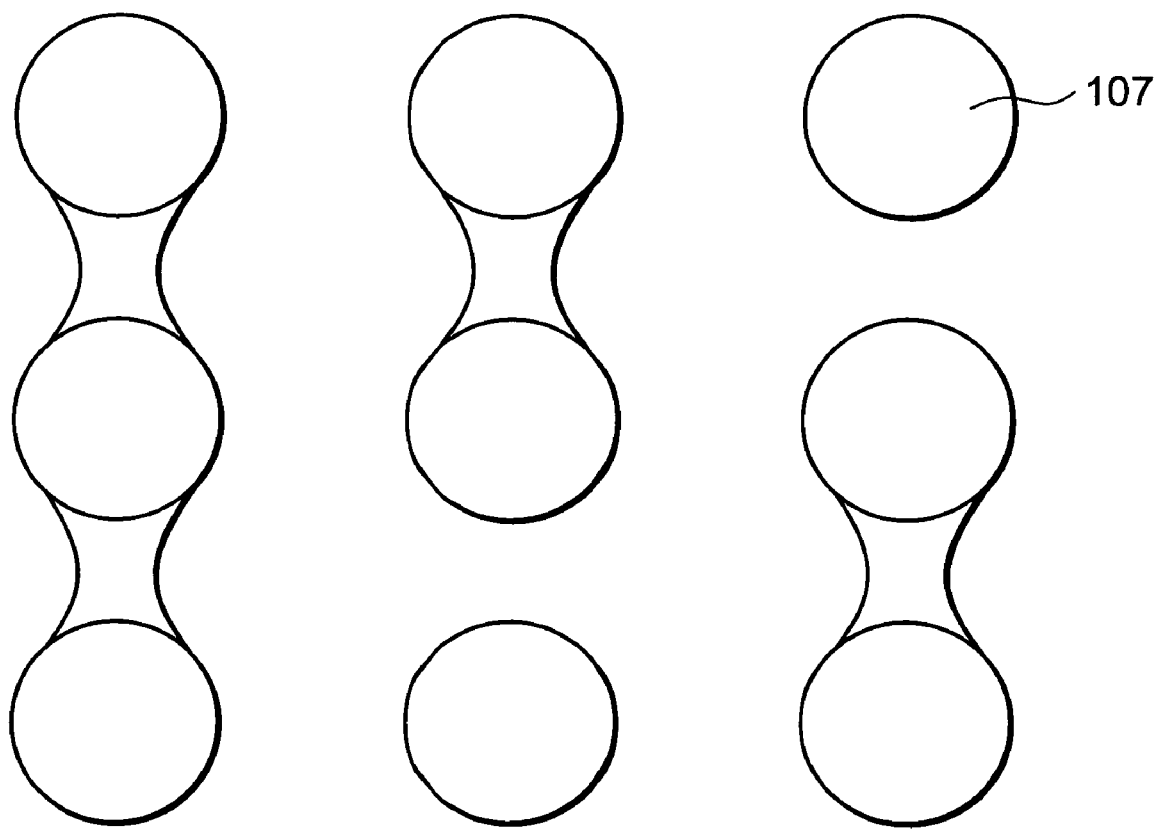
FIG. 6 is a view for illustrating a problem in conventional via formation.

The plurality of via opening patterns 101 are arranged to allow each side of the via opening pattern 101 to be diagonal with respect to the first direction and the second direction. Specifically, from the arrangement as illustrated in FIG. 5 illustrated as the conventional example, in which each of the sides of the via opening pattern 101 is parallel to or perpendicular to the wirings, the via opening pattern 101 is rotated at the same position with its center point being fixed. In other words, the via opening pattern 101 illustrated as the square in FIG. 5 is rotated with its center point being fixed to obtain the via opening pattern 101 which is arranged diagonally to the wirings as illustrated in FIG. 1. Preferably, each of the sides of the via opening pattern 101 is at an angle in the range of 30 degrees to 60 degrees or in the range of 120 degrees to 150 degrees with respect to the first and second directions. More preferably, each of the sides of the via opening pattern 101 is at 45 degrees or 135 degrees with respect to the first and second directions. When each of the sides of the via opening pattern 101 is at 45 degrees or 135 degrees with respect to the first and second directions, a distance between the via opening patterns becomes maximum.

Further, on the reticle of this embodiment, the plurality of via opening patterns 101 are arranged to satisfy the following condition. By rotating the via opening patterns 101 while fixing the center point of each of the via opening patterns, a minimum distance d1 between the two neighboring via opening patterns 101, each being diagonally arranged with respect to the first and second directions, is larger than a minimum distance d2 between the neighboring via opening patterns 101 when each of the sides of the via opening patterns 101 is arranged to be parallel to or to perpendicular to the first and second directions (FIGS. 1 and 5). Specifically, for the minimum distance between the two neighboring via opening patterns 101, the minimum distance when each side of the via opening pattern is diagonal with respect to the first and second directions is denoted by d1, whereas the minimum distance when each side of the via opening pattern is parallel or perpendicular to the first and second directions is denoted by d2. On the reticle of this embodiment, the via opening patterns are arranged to satisfy the relation: d1>d2 when the minimum distances d1 and d2 between the neighboring via opening patterns are compared after the minimum distance d1 is obtained by rotating the via opening patterns with their center points being fixed. With such an arrangement, the distance between the neighboring via opening patterns can be increased without lowering the degree of integration of the vias.

Figure 2:
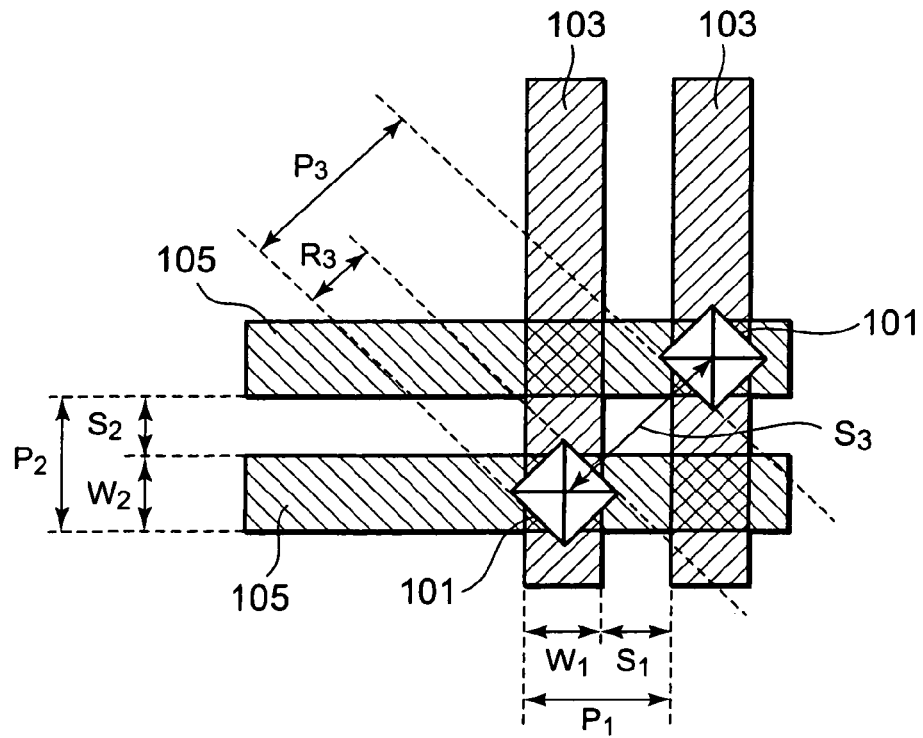
FIG. 2 is a view for illustrating a method of arranging via opening patterns on a reticle.

In this embodiment, as a method of arranging the plurality of via opening patterns 101, which satisfies the above-mentioned condition, the following method can be given. For example, the reticle having a minimum wiring pitch size between the vias which is larger than that between the first wirings 103 or the second wirings 105, on which each of the sides of the via opening pattern 101 is diagonal with respect to the first and second directions, can be given. The minimum wiring pitch size here is the sum of a minimum distance between the wirings and a wiring width. For example, as illustrated in FIG. 2, when the minimum distance between the first wirings 103 is S1 and a first wiring width is W1, a first minimum wiring pitch P1 is expressed by: S1+W1. When the minimum distance between the second wirings 105 is S2 and a second wiring width is W2, the second minimum wiring pitch P2 is expressed by: S2 and W2. Further, a minimum via pitch P3 is expressed by: (minimum distance S3 between the vias)+(via width R3). In this embodiment, the minimum pitch size between the vias is larger than the minimum wiring pitch size between the first wirings 103 or the second wirings 105. Specifically, a pair of the vias which are the closest to each other is diagonally arranged, preferably, is arranged in a via layer at about 45 degrees with respect to the wirings.

The wiring pitches in the case where two neighboring wirings are arranged along one of the directions, that is, are arranged parallel to each other have been described above. However, two neighboring wirings may be arranged along the first direction and the second direction, respectively. Even in such an arrangement, the wiring pitch when the two wirings do not perpendicularly cross each other is represented by the sum of the minimum distance between the neighboring two wirings and the wiring width. The wiring width here means a width of the wiring in a vertical direction with respect to a wiring length L when the wiring length L is a length of the wiring in a wiring extending direction.

In the arrangement as described above, the minimum via pitch P3 between the two neighboring via opening patterns is preferably $2^{1/2}$ times as large as the first minimum wiring pitch P1 or the second minimum wiring pitch P2 or larger, more preferably, $2^{1/2}$ times as large. In this embodiment, when the via opening patterns 101 are provided to cause the via minimum pitch to be $2^{1/2}$ times as large as the wiring pitch, the degree of integration of the vias is further increased.

Figure 3:
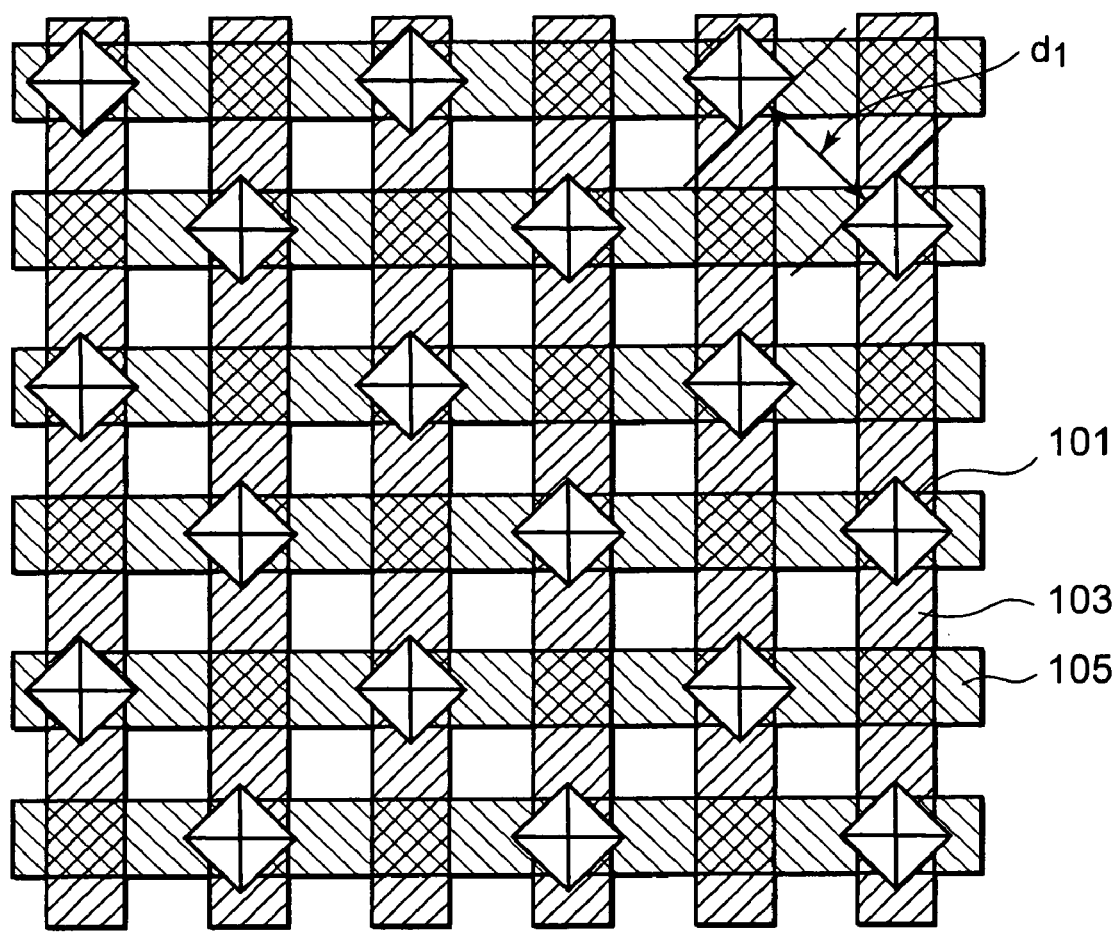
FIG. 3 is a schematic plan view illustrating another layout of the wirings and the vias according to the embodiment of the present invention.

In this embodiment, since the via opening patterns 101 are formed to be diagonal with respect to the wirings in the arrangement as described above, a process margin for the vias can be improved while the degree of integration of the vias is increased. As another example of the method of laying out the via opening patterns 101 as described above, a layout as illustrated in FIG. 3 can be given. In FIG. 3, the first wirings 103 in the first wiring layer and the second wirings 105 in the second wiring layer perpendicularly cross each other. The via opening patterns 101 are provided to arrange the vias at the positions where the first wirings 103 and the second wirings 105 overlap each other.

In this embodiment, the two neighboring via opening patterns 101 which are the closest to each other have a layout in which the sides of the two neighboring via opening patterns 101 face each other or the side of one of the two neighboring via opening patterns 101 and a corner of the other of the two neighboring via opening patterns 101 face each other when the neighboring via opening patterns 101 have the minimum distance therebetween. In this embodiment, the minimum distance between the neighboring via opening patterns becomes larger than that when the corner of one of the neighboring via opening patterns faces the corner of the other of the neighboring via opening patterns. Preferably, in this embodiment, the sides of the two neighboring via opening patterns 101, which are the closest to each other, face each other with the minimum distance therebetween, and the opposing sides are substantially parallel to each other (FIG. 2 and the like).

In this embodiment, although a length of each of the sides of the rectangular via opening pattern is appropriately set according to the wiring width or the distance between the wirings, the length of each of the sides is preferably 30 nm to 200 nm, more preferably, 50 nm to 180 nm, and further preferably, 50 nm to 100 nm. Preferably, the length of each of the sides of the via opening pattern is equal to the wiring width.

Although the distance between the wirings is not particularly limited here, it is preferable that the distance between the wirings be smaller to increase a wiring density. Moreover, the effects of this embodiment are particularly remarkable in the wiring layout having a small distance between the wirings. For example, the distance between the wirings in a wiring group in the same wiring layer is preferably 30 nm to 200 nm, more preferably, 50 nm to 180 nm, and further preferably, 70 nm to 170 nm. When the wiring density is within the range described above, the wiring density can be increased while keeping an adequate distance between the wirings. Moreover, the distance between the wirings may differ for each distance between the wirings, and the distances between the wirings may be equal to each other in the wiring group.

Although the wiring width is not particularly limited, it is preferable that the wiring width be smaller in view of the miniaturization of an element. For example, in consideration of the distance between the wirings, a diameter of the via, and the like, the wiring width is 30 nm to 200 nm, and preferably, 50 nm to 180 nm. The wiring width may differ or may be the same for each wiring.

In this embodiment, it is preferable that the wiring density be as high as possible for the miniaturization of the semiconductor device. The first wirings 103 and the second wirings 105 may have, for example, the minimum wiring pitch. The minimum wiring pitch is, for example, a value defined for each generation based on a design rule of the LSI.

By using the reticle according to this embodiment in the wiring structure described above, the plurality of vias for connecting the first wirings 103 and the second wirings 105 to each other are formed. A via hole for forming the via can be formed by light exposure using the reticle according to this embodiment. A light wavelength (λ) used for the light exposure is appropriately adjusted according to the distance between the wirings, the via diameter, the distance between the vias, and the like, and is preferably, 200 nm or less. Although not particularly limited, the light wavelength can be, for example, 30 nm to 200 nm.

In this embodiment, a specific arrangement of the via opening patterns 101 on the reticle can increase the minimum distance between the via opening patterns 101 without lowering the degree of integration of the vias. In particular, the angle of each of the sides of the via opening pattern 101 with respect to the wirings is made to fall within the above-mentioned range. As a result, even if the via opening pattern is at the same position, a larger minimum distance can be obtained. Therefore, the use of the reticle of this embodiment improves the resolution of the vias. Therefore, even in the wiring structure having a high wiring density, a good via shape can be efficiently formed in this embodiment.

Figure 7:
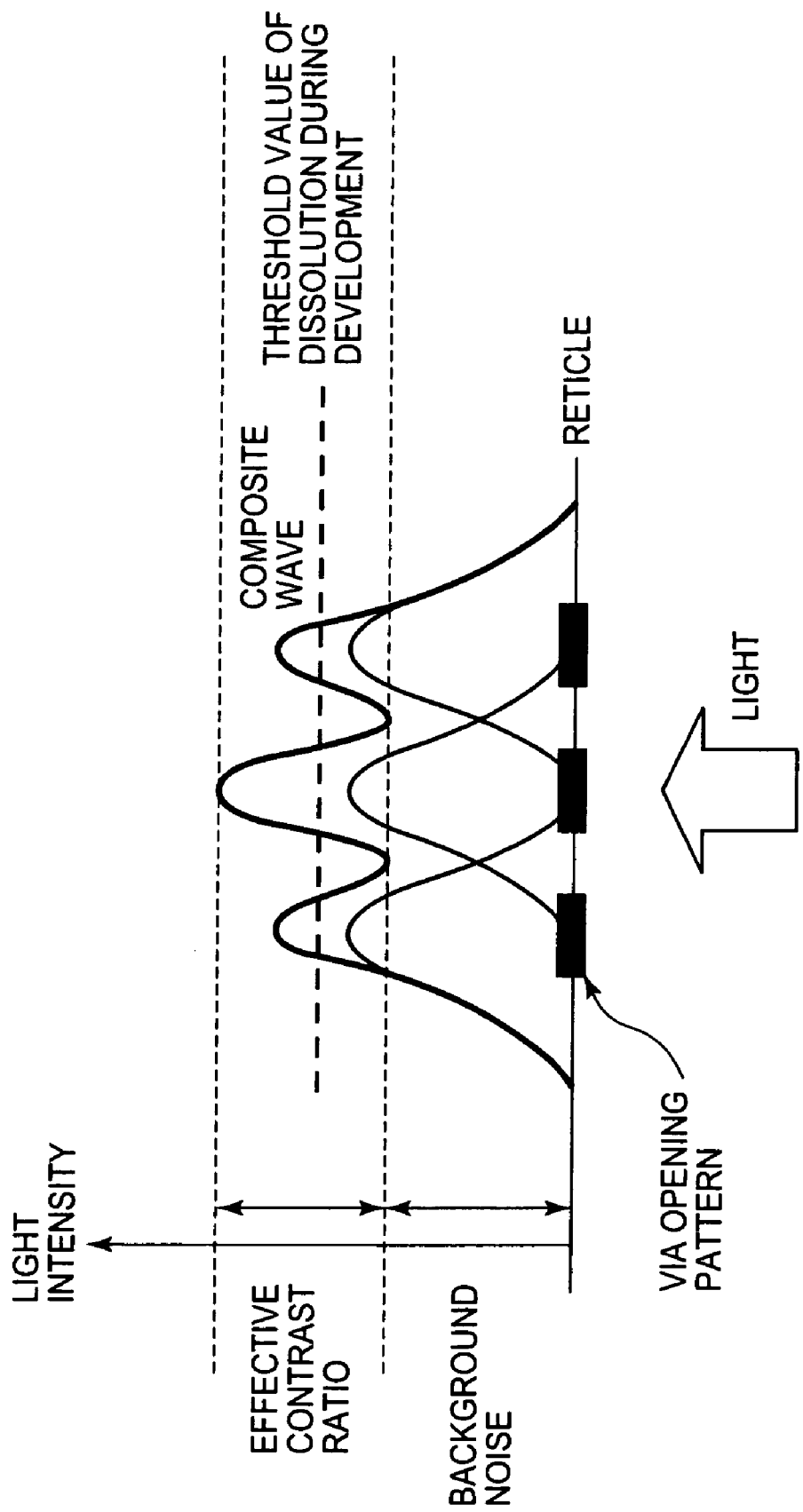
FIG. 7 is a graph showing a relation between a distance between the via opening patterns, a light intensity, and an effective contrast ratio.
Figure 8:
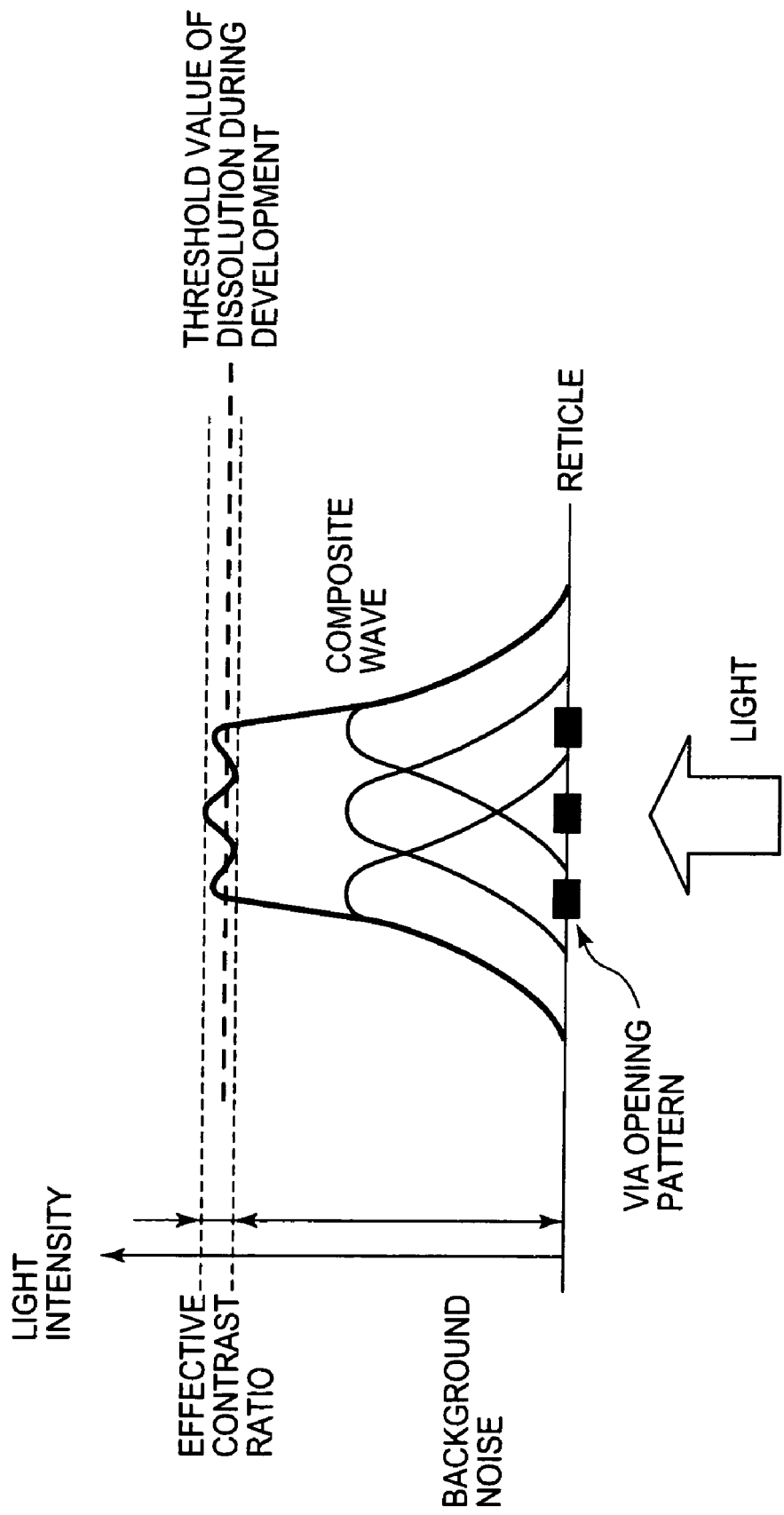
FIG. 8 is another graph showing the relation between the distance between the via opening patterns, the light intensity, and the effective contrast ratio.

As illustrated in FIG. 7, by increasing the distance between the via opening patterns, an effective contrast ratio for the light exposure can be increased. In comparison with the effective contrast ratio illustrated in FIG. 8, the effective contrast ratio is increased to improve the resolution of the vias as illustrated in FIG. 7. In comparison with the conventional arrangement of the via opening patterns at the same degree of integration of the vias, the light intensity for the light exposure can be clearly distinguished in this embodiment. Therefore, the via shape is hardly deformed due to the dissolution during the development. Thus, a short between the vias, the deformation of the via shape, and the like can be restrained to improve the yield, reliability, and lifetime of the products.

Although a method of fabricating the reticle, on which each of the sides of the via opening pattern is diagonal with respect to the wirings, is not particularly limited, the following methods can be given, for example. In a first method, the reticle is rotated to be diagonal. Then, by using an EB point beam, the rectangular via opening pattern is drawn to be diagonal with respect to each of the sides of the reticle. In a second method, without rotating the reticle, the rectangular via is drawn to cause each of the sides of the via opening pattern to be diagonal with respect to each of the sides of the reticle. In this case, a beam shaped into a diagonal via shape like a stamp is formed to draw the vias at a time.

In general, the via opening patterns on the reticle are formed by the method of scanning the EB point beam. By such a method, the via opening pattern is generally formed to have a rectangular shape and to have each of the sides parallel to or perpendicular to the wirings. Further, in consideration of a working efficiency, a reduction in reticle price, and the like, all the via opening patterns are normally formed to have the same shape. Therefore, when the via opening patterns are formed diagonally with respect to the wirings and each of the sides of the reticle, an isolated via is also formed as a diagonal via. Moreover, for the fabrication of the diagonal rectangular via opening patterns, it is necessary to add another operation to the conventional method. It is difficult to fabricate the diagonal rectangular via opening patterns. Thus, the fabrication of the reticle as described above requires various efforts. Accordingly, the via opening patterns in the specific arrangement described in this embodiment are not formed in the actual conditions.

In this embodiment, however, a new effect obtained by forming each of the sides of the via opening pattern to be diagonal with respect to the wirings is found as described above.

Next, a method of fabricating the semiconductor device, in which each of the vias is formed at a predetermined position by using the reticle according to this embodiment, is described. The semiconductor device fabricated in this embodiment includes the first wiring layer including the first wirings, the second wiring layer including the second wirings, and the vias for connecting the first wirings and the second wirings to each other. Further, the first wirings and the second wirings are provided along the first direction or the second direction. The first direction and the second direction perpendicularly cross each other.

In the method of fabricating the semiconductor device according to this embodiment, the first wiring layer including the first wirings is formed on or above a surface of a silicon substrate. Next, an interlayer insulating film, which covers the first wiring layer, is formed on the entire surface of the first wiring layer. For the interlayer insulating film, a known material can be used. A resist film is further formed on the interlayer insulating film.

Next, the via holes having a predetermined arrangement are formed by using the photolithography technique, as illustrated in FIG. 1. Specifically, the light exposure is performed by using the reticle according to this embodiment. Thereafter, the development is performed to form concave portions on the resist film. Each of the concave portions is located at the position where the first wiring 103 and the second wiring 105 overlap each other in plan view, and is used for forming the via hole.

Further, the interlayer insulating film is etched by using the resist film having the concave portions formed thereon as a mask. As a result, the via holes for the connection to the first wirings are formed. A sectional shape of each of the via holes actually formed through the interlayer insulating film by the rectangular via opening patterns is circular.

After the formation of the via holes, a conductive film is buried in the via hole to form the via. Thereafter, the second wiring layer including the second wirings connected to the vias is formed on the vias and the interlayer insulating film.

By the method described above, the semiconductor device according to this embodiment, which includes the vias for connecting the first wirings and the second wirings to each other, can be fabricated. In the semiconductor device according to this embodiment, the reticle and the method of laying out the wirings and the vias according to this embodiment are used to restrain the deformation of the via shape and the short between the vias. Thus, the semiconductor device with the improved yield and lifetime can be fabricated.

Although the embodiment of the present invention has been described above referring to the drawings, the embodiment is a mere exemplification of the present invention. Therefore, various constructions other than those described above can also be adopted.

EXAMPLES

Example 1

The via holes were formed by the photolithography using the layout of the wirings and the vias, which is illustrated in FIG. 1. The conditions used in this Example 1 were as follows. The shape of the via opening pattern was square. The minimum distance d1 between the neighboring via opening patterns was expressed by: $(2 \times 2^{1/2}-1) \times S$, where S is the distance between the wirings.

As specific conditions, the distance S between the wirings was 70 nm, the wiring width W was 70 nm, the wiring pitch P was 140 nm, the length R of each of the sides of the via opening pattern was 70 nm, and the angle of each of the sides of the via opening pattern with respect to the wiring was 45 degrees or 135 degrees. In this arrangement, the minimum distance d1 between the neighboring via opening patterns was: $(2 \times 2^{1/2}-1) \times S = 128$ nm. The light wavelength ($\lambda$) for the light exposure was 193 nm.

The shape of the via hole formed after the photolithography was circular. The occurrence of the linkage between the vias was not observed. Therefore, good via holes were formed.

Example 2

The via holes were formed by the photolithography using the layout of the wirings and the vias, which is illustrated in FIG. 3. This Example 2 is the same as Example 1 except that the first wirings 103 and the second wirings 105 were arranged to perpendicularly cross each other. The conditions used in this Example 2 were the same as those used in Example 1. Therefore, the minimum distance d1 between the neighboring via opening patterns was: $(2 \times 2^{1/2}-1) \times S$, where S is the distance between the wirings, and was obtained as 128 nm.

The shape of the via hole formed after the photolithography was circular. The occurrence of the linkage between the vias was not observed. Therefore, good via holes were formed.

Comparative Example 1

Figure 4:
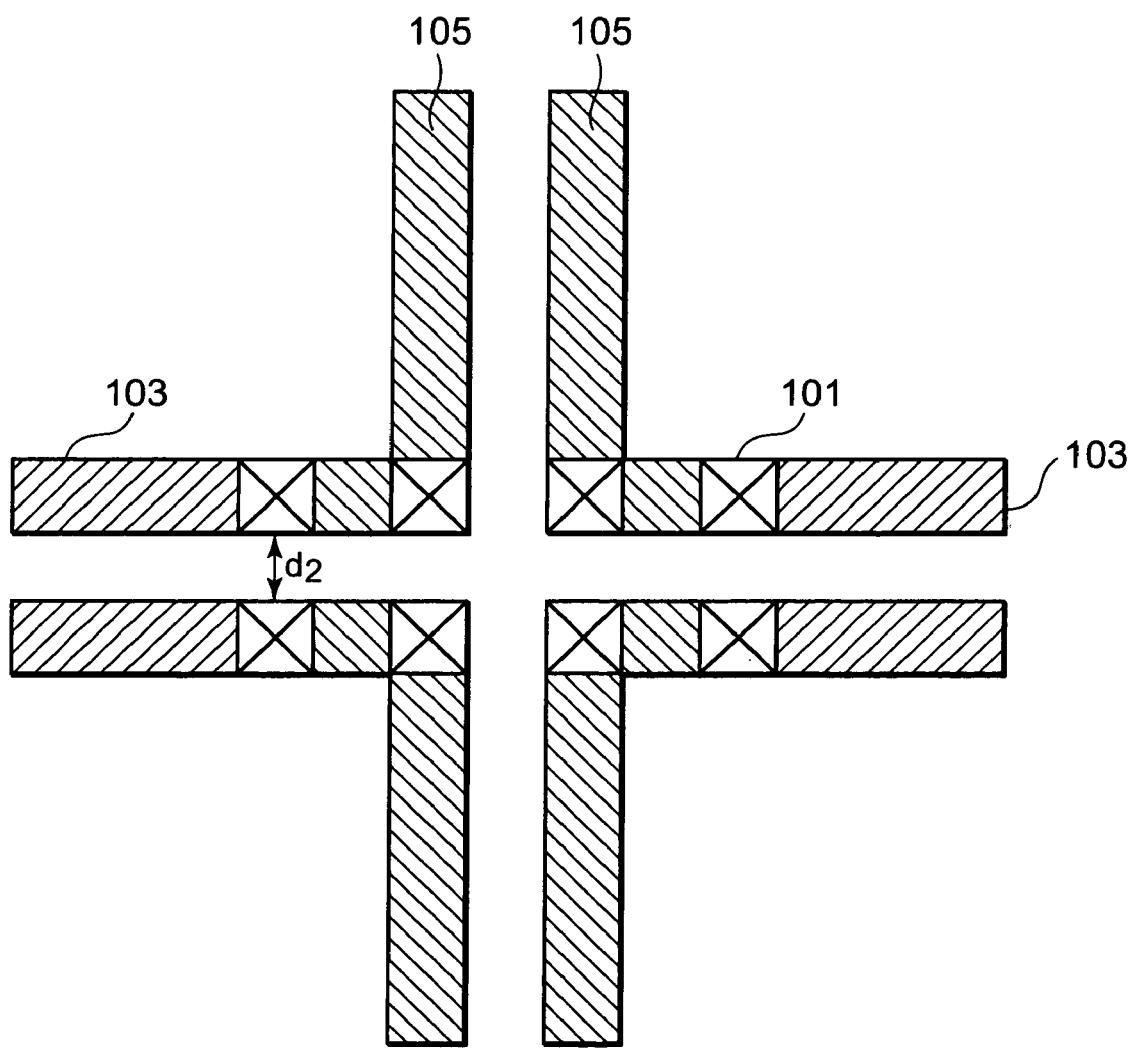
FIG. 4 is a schematic plan view illustrating a conventional layout of the wirings and the vias.

The via holes were formed by using the same conditions as those in Example 1 except that the layout of the wirings and the vias, which is illustrated in FIG. 4, was used. Specifically, in this Comparative Example 1, the reticle, on which each of the sides of the via opening patterns is parallel to or perpendicular to the wirings, was used. The minimum distance d2 between the via opening patterns was equal to the minimum distance S between the wirings, and was 70 nm.

The loss of shape of the via hole formed after the photolithography occurred. Moreover, the complete linkage between the neighboring vias arranged with the minimum distance therebetween was observed for some vias.

Comparative Example 2

The via holes were formed by using the same conditions as those in Example 1 except that the layout of the wirings and the vias, which is illustrated in FIG. 5, was used. Specifically, in this Comparative Example 2, the reticle, on which each of the sides of the via opening patterns is parallel to or perpendicular to the wirings, was used. The minimum distance d2 between the via opening patterns was expressed by $2^{1/2} \times S$, where S is to the minimum distance between the wirings, and was 99 nm.

Although the shape of the formed via hole was circular, the loss of shape of the top of the via occurred for some vias. Moreover, the linkage between the neighboring vias arranged with the minimum distance therebetween was observed for some vias.

In each of Examples 1 and 2 and Comparative Examples 1 and 2, the sectional shape of the finally obtained via was circular. In Comparative Examples 1 and 2, however, the occurrence of the linkage between the vias was observed for some vias. If the linkage between the vias occurs as described above, the short between the vias occurs to cause the malfunction of the semiconductor device. Even if the linkage between the vias did not occur in Comparative Examples 1 and 2, it is expected that the via losing its shape brings about the reduction in initial breakdown voltage during the operation of the semiconductor device due to the short between the vias.

In Examples 1 and 2, the minimum distance d1 between the neighboring via opening patterns was expressed by: $(2 \times 2^{1/2}-1) \times S$. On the other hand, in Comparative Example 1, the minimum distance d2 between the neighboring via opening patterns was S as illustrated in FIG. 4. In Comparative Example 2, the minimum distance d2 between the neighboring via opening patterns was expressed by: $2^{1/2} \times S$ as illustrated in FIG. 5. Specifically, the minimum distance d1 between the neighboring via opening patterns in Examples 1 and 2 was about 1.8 times as large as that in the conventional via arrangement illustrated in FIG. 4, and was about 1.3 times as large as that in the conventional via arrangement illustrated in FIG. 5. In each of Examples 1 and 2 and Comparative Examples 1 and 2, the minimum distance between the via opening patterns is smaller than the light wavelength used for the light exposure. In this case, the effects in the improvement of the resolving power, which are obtained by increasing the minimum distance between the neighboring via opening patterns to 1.3 times and 1.8 times as large as that in the conventional via arrangement, respectively, are remarkably great.

Figure 9:
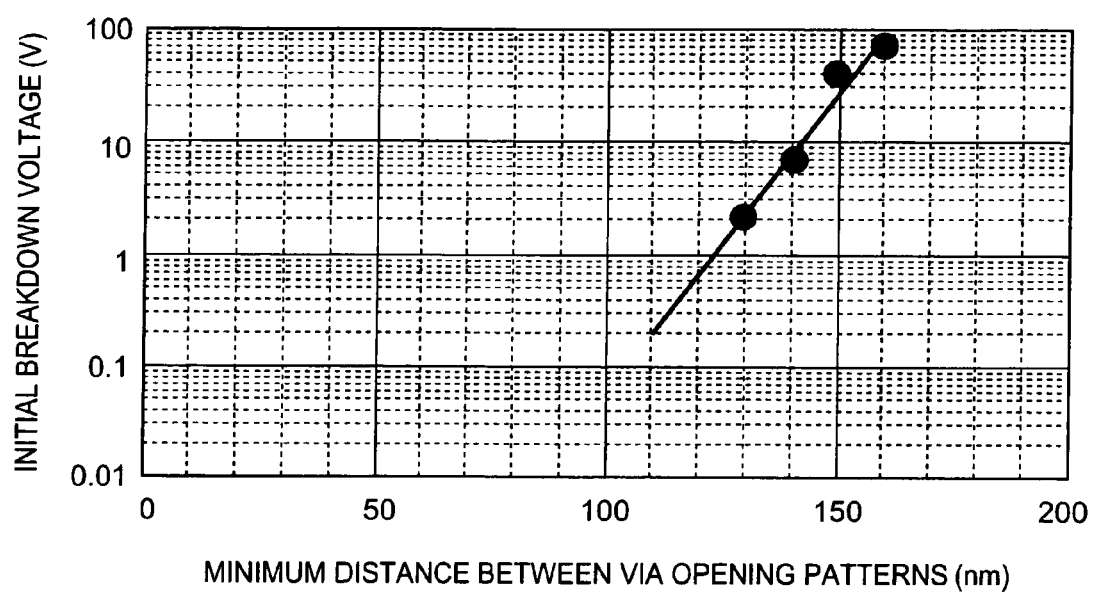
FIG. 9 is a graph showing the relation between the distance between the via opening patterns and an initial breakdown voltage (V) in a semiconductor device having a via arrangement shown in FIG. 4.

FIG. 9 is a graph showing the relation between a minimum distance between the via opening patterns and the initial breakdown voltage of an LSI in the LSI having the via arrangement shown in FIG. 4. The measurement was carried out by extracting about 20 samples from each of wafers respectively fabricated with the minimum via distances of 130 nm, 140 nm, 150 nm, and 160 nm, assembling the samples, and then scanning a voltage. An average value of the voltages, at which the LSI breaks down for the respective samples, is obtained as the initial breakdown voltage. Referring to FIG. 9, when the minimum distance between the via opening patterns is increased from 130 nm to 140 nm, the initial breakdown voltage is increased from about 2V to about 7V. Specifically, by increasing the distance between the via opening patterns only by about 10%, the initial breakdown voltage is improved to about 3.5 times as large. Moreover, by increasing the distance between the vias from 130 nm to 160 nm, the initial breakdown voltage is increased from about 2V to about 75V. Specifically, when the distance between the via opening patterns is increased to about 1.2 times as large, the initial breakdown voltage is remarkably improved to about 40 times as large. In this Examples 1 and 2, the distance between the via opening patterns is increased to about 1.3 times as large as that of Comparative Examples 1 and 2. Therefore, it is expected that the initial breakdown voltage is remarkably improved.

What is claimed is:

1. A reticle used for forming a plurality of vias for connecting a plurality of first wirings provided in a first wiring layer and a plurality of second wirings provided in a second wiring layer formed above the first wiring layer to each other, the plurality of first wirings and the plurality of second wirings being provided along one of a first direction and a second direction, the first direction and the second direction perpendicularly crossing each other,
the reticle comprising a plurality of via opening patterns for forming the plurality of vias,
wherein each of the plurality of via opening patterns has a rectangular shape,
wherein the plurality of via opening patterns are arranged to cause each side of each of the plurality of via opening patterns to be diagonal with respect to both of the first direction and the second direction, and
wherein a minimum distance between neighboring two of the plurality of via opening patterns, which are arranged diagonally with respect to the first direction and the second direction, is made to be larger, by rotating the plurality of via opening patterns with a center point of each of the plurality of via opening patterns being fixed, than a minimum distance between the plurality of via opening patterns when the plurality of via opening patterns are arranged to cause each side of each of the plurality of via opening patterns to be one of parallel to and perpendicular to the first direction and the second direction.

2. A reticle according to claim 1, wherein the plurality of via opening patterns has a square shape.

3. A reticle according to claim 1, wherein each side of each of the plurality of via opening patterns is formed at one of 45 degrees and 135 degrees with respect to the first direction and the second direction.

4. A reticle according to claim 1, wherein a minimum via pitch between the neighboring two of the plurality of via opening patterns is larger than one of a first minimum wiring pitch obtained by adding a minimum distance of distances between neighboring ones of the plurality of first wirings and a first wiring width, and a second minimum wiring pitch obtained by adding a minimum distance of distances between neighboring ones of the plurality of second wirings and a second wiring width.

5. A reticle according to claim 4, wherein the minimum via pitch is $2^{1/2}$ times as large as one of the first minimum wiring pitch and the second minimum wiring pitch or larger.

6. A reticle according to claim 1, wherein the plurality of via opening patterns is arranged to have a zigzag pattern at positions where the plurality of first wirings and the plurality of second wirings overlap each other in a plan view.

7. A method of laying out wirings and vias, comprising:
providing a plurality of first wirings in a first wiring layer;
forming a plurality of the vias connected to the plurality of first wirings by light exposure using a reticle; and
providing a plurality of second wirings to be connected to the plurality of vias in a second wiring layer different from the first wiring layer, wherein:
the plurality of first wirings and the plurality of second wirings are provided along one of a first direction and a second direction, the first direction and the second direction perpendicularly crossing each other;
the reticle includes a plurality of via opening patterns for forming the plurality of vias;
each of the plurality of via opening patterns has a rectangular shape;
the plurality of via opening patterns are arranged to cause each side of each of the plurality of via opening patterns to be diagonal with respect to both of the first direction and the second direction; and
a minimum distance between neighboring two of the plurality of via opening patterns, which are arranged diagonally with respect to the first direction and the second direction, is made to be larger, by rotating the plurality of via opening patterns with a center point of each of the plurality of via opening patterns being fixed, than a minimum distance between the plurality of via opening patterns when the plurality of via opening patterns are arranged to cause each side of each of the plurality of via opening patterns to be one of parallel to and perpendicular to the first direction and the second direction.

8. A method of laying out wirings and vias according to claim 7, wherein the plurality of via opening patterns has a square shape.

9. A method of laying out wirings and vias according to claim 7, wherein each side of each of the plurality of via opening patterns is formed at one of 45 degrees and 135 degrees with respect to each of the plurality of first wirings and each of the plurality of second wirings.

10. A method of laying out wirings and vias according to claim 7, wherein each of the plurality of first wirings and each of the plurality of second wirings perpendicularly cross each other.

11. A method of laying out wirings and vias according to claim 7, wherein the plurality of first wirings and the plurality of second wirings have minimum wiring pitches, respectively.

12. A reticle according to claim 1, wherein each side of each of the plurality of via opening patterns is formed at an angle in a range of 30 degrees to 60 degrees or in a range of 120 degrees to 150 degrees with respect to the first direction and the second direction.

13. A reticle according to claim 1, wherein the neighboring two of the plurality of via opening patterns, which are closest to each other, have a layout in which sides of the neighboring two of the plurality of via opening patterns face each other or the side of one of the neighboring two of the plurality of via opening patterns and a corner of other of the neighboring two of the plurality of via opening patterns face each other when the neighboring two of the plurality of via opening patterns have a minimum distance therebetween.

14. A reticle according to claim 13, wherein the minimum distance between the neighboring two of the plurality of via opening patterns becomes larger than that when a corner of one of the neighboring two of the plurality of via opening patterns faces the corner of the other of the neighboring two of the plurality of via opening patterns.

15. A reticle according to claim 13, wherein the sides of the neighboring two of the plurality of via opening patterns face each other with the minimum distance therebetween, and opposing sides of the neighboring two of the plurality of via opening patterns are substantially parallel to each other.

16. A reticle according to claim 13, wherein a length of each of sides of the via opening patterns is equal to a respective wiring width.

17. A method of laying out wirings and vias according to claim 7, wherein each side of each of the plurality of via opening patterns is formed at an angle in a range of 30 degrees to 60 degrees or in a range of 120 degrees to 150 degrees with respect to the first direction and the second direction.

18. A method of laying out wirings and vias according to claim 7, wherein the neighboring two of the plurality of via opening patterns, which are closest to each other, have a layout in which sides of the neighboring two of the plurality of via opening patterns face each other or a side of one of the neighboring two of the plurality of via opening patterns and a corner of an other of the neighboring two of the plurality of via opening patterns face each other when the neighboring two of the plurality of via opening patterns have a minimum distance therebetween.

19. A method of laying out wirings and vias according to claim 18, wherein the minimum distance between the neighboring two of the plurality of via opening patterns becomes greater than a minimum distance when a corner of one of the neighboring two of the plurality of via opening patterns faces the corner of the other of the neighboring two of the plurality of via opening patterns.

20. A method of laying out wirings and vias according to claim 18, wherein the sides of the neighboring two of the plurality of via opening patterns face each other with the minimum distance therebetween, and opposing sides of the neighboring two of the plurality of via opening patterns are substantially parallel to each other.

* * * * *